United States Patent [19]

Dingwall

[11] Patent Number: 4,463,273
[45] Date of Patent: Jul. 31, 1984

[54] ELECTRONIC CIRCUITS AND STRUCTURES EMPLOYING ENHANCEMENT AND DEPLETION TYPE IGFETS

[75] Inventor: Andrew G. F. Dingwall, Bridgewater, N.J.

[73] Assignee: RCA Corporation, New York, N.Y.

[21] Appl. No.: 314,849

[22] Filed: Oct. 26, 1981

[51] Int. Cl.³ .................. H03K 19/096; H03K 19/20; H03K 19/003; H03K 3/356
[52] U.S. Cl. ............................. 307/450; 307/443; 307/452; 307/279; 307/579; 365/156; 365/188
[58] Field of Search .............. 307/279, 448, 450, 451, 307/443, 446, 475, 288, 579, 581–585; 365/156, 188

[56] References Cited

U.S. PATENT DOCUMENTS

| | | | |
|---|---|---|---|
| 3,509,379 | 4/1970 | Rapp | 307/279 |
| 3,675,144 | 7/1972 | Zuk | 307/443 X |
| 3,900,746 | 8/1975 | Kraft et al. | 307/475 |
| 3,984,703 | 10/1976 | Jorgensen | 307/443 X |
| 4,063,225 | 12/1977 | Stewart | 365/156 |
| 4,075,690 | 2/1978 | Oberman et al. | 307/279 X |
| 4,110,633 | 8/1978 | Blazer et al. | 307/450 |
| 4,196,443 | 4/1980 | Dingwall | 357/68 |
| 4,216,390 | 8/1980 | Stewart | 307/279 X |
| 4,256,974 | 3/1981 | Padgett et al. | 307/475 |

Primary Examiner—Larry N. Anagnos
Attorney, Agent, or Firm—Joseph S. Tripoli; George E. Haas; Henry I. Schanzer

[57] ABSTRACT

A controllable impedance means is connected in series with the conduction path of transistors forming a complementary inverter for selectively "skewing" the inverter in a direction to center its toggle point with respect to the signals applied to the inverter input. The "skewed" inverter is thereby compensated for offsets or asymmetry in its input signals. Also disclosed is the use of skewed inverters to form memory cells which can be easily written to both binary conditions. Also disclosed is the use of the controllable impedances as "crossunders" to enable the fabrication of very compact "skewable" inverters and memory cells.

22 Claims, 11 Drawing Figures

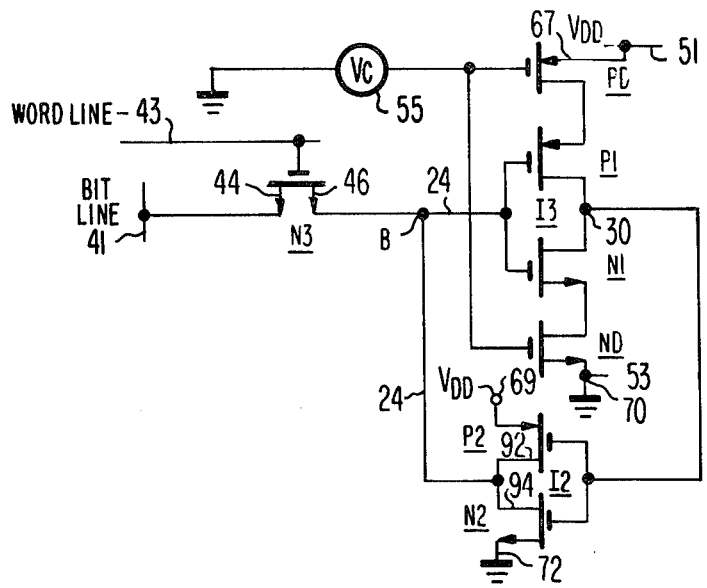
Fig.5
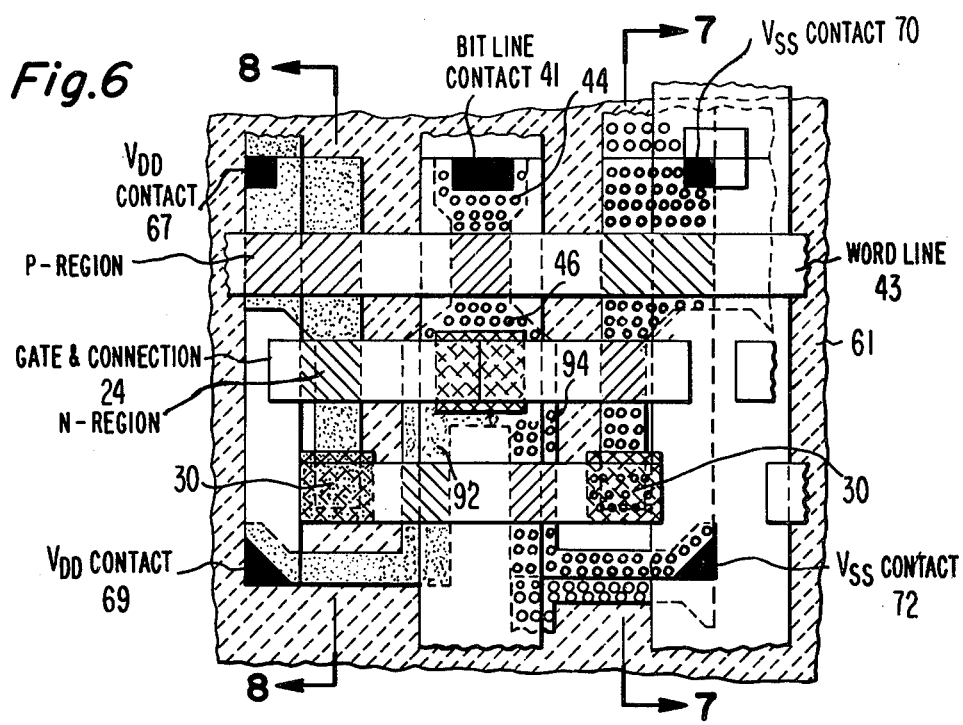
Fig.6
METAL OR POLYSILICON | P+EPI | N+EPI | P-REGION | N-REGION | SAPPHIRE SUBSTRATE | BURIED CONTACT

ELECTRONIC CIRCUITS AND STRUCTURES EMPLOYING ENHANCEMENT AND DEPLETION TYPE IGFETS

This invention relates to inverters employing insulated-gate, field-effect transistors (IGFETs).

A single transistor transmission gate often is used to selectively couple signals from one circuit to another. In such use the gating transistor operates in the grounded mode—i.e., common source or common emitter—for one value of input signal and in the follower mode—i.e., as a source follower or emitter follower—for another value of input signal, and this can cause problems.

In the follower mode, the voltage transmitted to the receiving point does not reach the full value of the sending voltage because of the threshold characteristic of the gating transistor. In this mode there is a voltage offset ($V_T$ or $V_{BE}$) between the control electrode (gate or base) of the transistor and one end of its conduction path and this same offset appears across the conduction path of the transistor. Depending upon the value of the threshold voltage ($V_T$) of the transmission gate transistor, the voltage actually transmitted to the receiving point may be insufficient to trigger (or turn-off) a circuit or element connected at the receiving point.

Various solutions have been suggested to overcome the problem above. One is to employ two complementary transistors per transmission gate. However, the use of two complementary transistors per gate requires complementary switching signals and much more space than the use of a single transistor per gate and thus is not desirable in some applications.

Another solution is to overdrive the transmission gate by pulses having an amplitude equal to at least the sum of the signal and threshold voltage. Overdriving the gate transistor is not feasible in all instances and, in practice, may require more than one power supply to generate control signals of large amplitude. Moreover, overdriving increases the power consumption and the noise level in the circuit and these are serious disadvantages.

Still another suggestion is the use of "offsetting" means coupled to the main conduction path of an inverter, where the inverter input is connected to a gating transistor in order to compensate for the "offset" of the gating transistor. However, in this case the signal produced at the output of the inverter is offset in value relative to the input signal. Thus a level-shift means must be added to restore the signal to the desired level. In some applications the need to restore the signal level and the space needed for the level shift means negate the advantage of the offsetting means.

One aspect of the present invention involves the use of a controllable impedance means connected in series with the conduction path of transistors forming a complementary inverter for selectively "skewing" the inverter in a direction to center its toggle point with respect to the signals applied to the inverter input. The "skewed" inverter is thereby compensated for offsets or asymmetry in its input signals.

According to another aspect of the invention, skewed inverters are used to form memory cells which can be easily placed in either binary condition.

Still another aspect of the invention is the use of the controllable impedances as "cross-unders" to enable the fabrication of "skewable" inverters requiring very little space.

In the accompanying drawing in which like reference characters denote like components:

FIG. 5 is a schematic drawing of another memory cell circuit embodying the invention;

FIG. 6 is a top view of a portion of an integrated circuit including a memory cell of the type shown in FIG. 5;

Figure 1A:
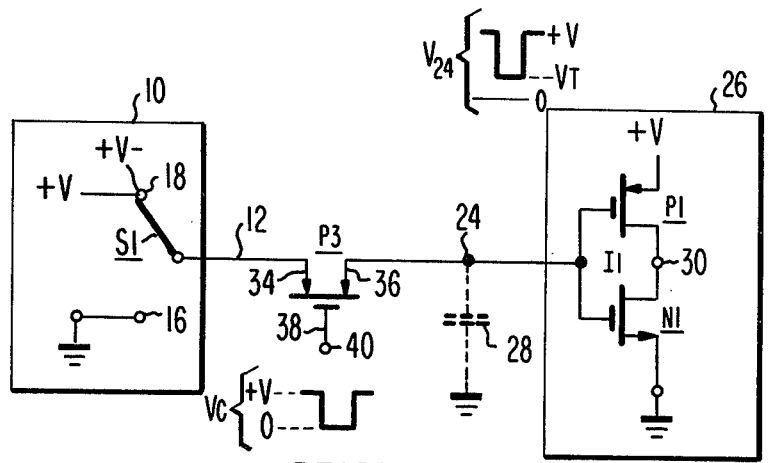
FIGS. 1A and 1B are schematic diagrams of prior art transmission gate circuits.

In the discussion to follow insulated-gate field-effect transistors (IGFETs) of the enhancement and depletion types are used in the FIGURES to illustrate the invention. In the FIGURES enhancement IGFETs of P conductivity type are identified by the letter P followed by a particular reference numeral and depletion IGFETs of P conductivity type are identified by the letters PD. IGFETs of P conductivity type are also identified by an arrow pointing towards the body of the transistor. Enhancement IGFETs of N conductivity type are identified by the letter N followed by a particular reference numeral while depletion IGFETs are identified by the letters ND. Each IGFET of N conductivity type is also identified by an arrow pointing away from the body of the transistor. In addition:

1. The IGFETs used have first and second electrodes which define the ends of a conduction path and a control electrode (gate) whose applied potential determines the conductivity of the conduction path. The first and second electrodes of an IGFET are referred to as the source and drain electrodes. For a P type IGFET the source electrode is defined as that one of the first and second electrodes having the more positive (higher) potential applied thereto. For an N type IGFET, the source electrode is defined as that one of the first and second electrodes having the less positive (lower) potential applied thereto.

2(a). For enhancement type IGFETs conduction occurs when the applied gate-to-source potential ($V_{GS}$) is in a direction to forward bias the gate with respect to the source and is greater in magnitude than a given value which is defined as the threshold voltage ($V_T$). Thus, where the applied $V_{GS}$ is in a direction to forward bias the transistor but is lower in amplitude than $V_T$ the transistor remains cut off and there is substantially no current flow in the conduction channel. [Note that this is also applicable to bipolar devices, where for conduction to occcur the base must be forward biased with respect to the emitter by a large signal than the base-to-emitter junction voltage ($V_{BE}$)].

2(b). For depletion type IGFETs conduction exists even with zero gate-to-source potential. Conduction may be increased by applying a forward bias between the gate and source or may be decreased (and eventually stopped) by applying a substantial reverse bias between the gate and source electrodes.

3. IGFETs are bidirectional in the sense that when an enabling signal is applied to the control electrode, current can flow in either direction in the conduction path between the first and second electrodes, i.e. the source and drain are interchangeable.

4. When used as a source (or emitter) follower, the voltage ($V_S$) at the source electrode "follows" the signal applied at the gate ($V_G$) but is offset with respect to the gate by a voltage whose amplitude is equal to the threshold voltage ($V_T$) of the device, $[V_S = V_G - V_T]$. It is this $V_T$ offset which creates a basic problem when using a single transistor transmission gate.

The problem solved by the invention is best understood by first referring to FIG. 1A which shows a known transmission gate arrangement.

An input or sending source, represented by box 10 produces signals at its output terminal 12 by means of a switch S1 having a switch arm which may be connected either to a terminal 16 which is connected directly to ground or to a terminal 18 to which is applied a potential of $+V$ volts. Thus, if the switch arm is at terminal 18, the voltage ($V_{12}$) at sending point 12 is $+V$ volts and if the switch arm is at terminal 16, $V_{12}$ is 0 volt.

A transmission gate comprising a P-type field-effect transistor P3 has its conduction path, whose ends are defined by electrodes 34 and 36, connected between sending terminal 12 and receiving terminal 24. The gate electrode 38 of P3 is connected to a terminal 40, to which is applied a control signal ($V_C$) having a potential of either zero volts or $+V$ volts. Transistor P3 is turned-off (disabled) when $V_C$ is at $+V$ volts, and is turned-on (enabled) when $V_C$ is lower than the potential at its source electrode by an amount exceeding the $V_T$ of P3.

A load 26 whose input impedance includes a (distributed or discrete) capacitor 28 is connected to the receiving terminal 24. The load 26 includes a complementary inverter I1 comprised of transistors N1 and P1. Transistors N1 and P1 have their drain electrodes connected in common to output point or node 30, their source electrodes connected to ground and $+V$, respectively, and their gate electrodes connected to input node 24.

Assume that capacitor 28 initially is discharged, that P3 is enabled ($V_C = 0$ volts) and that $V_{12}$ is at $+V$ volts. For the voltage conditions given, P3 operates in the common source mode wherein electrode 34 is the source electrode and electrode 36 is the drain electrode. Because the source is at $+V$ volts, a constant potential differential of V volts exists between the source electrode 34 and the gate electrode 38, ($V_{GS} = +V$) and the conduction path of P3 remains biased in a low impedance (high conductivity) state so long as the source and gate voltages remain at these values. Therefore, capacitor 28 is able to fully charge through the conduction path of P3 and the voltage ($V_{24}$) at terminal 24 will go to $+V$ volts. Thus, for this mode of operation of P3 the full voltage ($+V$) at terminal 12 is transmitted to terminal 24.

Assume now that S1 makes contact with terminal 16, that P3 is either already "on" or is turned "on" and that the initial voltage ($V_{36}$) at electrode 36 is $+V$ volts (capacitor 28 is fully charged). $V_{12}$ and $V_C$ are set to ground potential, and P3 now operates as a source follower, with electrode 36 functioning as the source electrode.

When P3 is initially rendered conductive, $V_{24}$ is at $+V$ volts and a differential of V volts exists between source electrode 36 and gate electrode 38. As capacitor 28 discharges, the potential difference between source (36) and gate (38) decreases, causing an increase in the impedance of the conduction channel of P3. When the capacitor 28 is discharged such that $V_{24}$ has a value equal to the $V_T$ of P3, P3 becomes non-conducting and the capacitor 28 discharges no further (except for leakage current). Thus, with the input grounded, $V_{24}$ remains at a potential level equal to $V_T$.

Thus, for one direction of conduction of the single transistor transmission gate, the receiving terminal 24 charges up to the value of the input ($+V$ volts) but for the other direction of conduction the receiving terminal does not discharge to the value of the input (0 volt); i.e. terminal 24 remains charged up to $V_T$ volts where $V_T$ is the offset of the gating transistor. The incomplete discharge of terminal 24 results in problems described below. Assume, for example, that $+V = 5$ volts and that the $V_T$ of P3 $= V_T$ of P1 $= V_T$ of N1 $= 1$ volt. For the condition where $V_{12}$ is at ground and P3 is enabled and conducts in the source follower mode, $V_{24}$ will remain at approximately 1 volt. This is sufficient to maintain N1 conducting, even though N1 should be turned-off when $V_{12}$ is equal to zero volts. Thus, both P1 (which was to be turned-on) and N1 (which was intended to be turned-off) conduct at the same time. P1 and N1 thus provide a low impedance conduction path between $+V$ and ground which results in a high level of power dissipation. Also, the output level at output 30 is undefined being somewhere between $+V$ volts and ground depending on the conduction level through P1 and N1 and the impedance ratio of P1 to N1.

Thus, the use of a single gating transistor, which is ideal because of its simplicity, is rendered unsuitable for many applications because of the $V_T$ offset of the gating transistor conducting in the source follower mode.

Figure 1B:
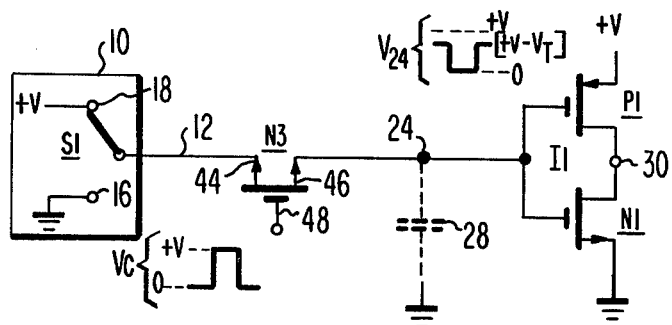

Replacing P3 by an N type transistor N3, as shown in FIG. 1B, results in a similar problem to the one described except that now the receiving terminal cannot be charged up to the $+V$ level of the sending voltage. When N3 is enabled, (by the applications of $+V$ volts to its gate electrode), and $V_{12}$ is at ground, N3 operates in its common source mode and terminal 24 is discharged to zero potential. However, when $V_{12}$ is at $+V$ volts and N3 is enabled ($+V$ volts is applied to its gate electrode), electrode 46 of N3 becomes the source electrode and the maximum voltage at terminal 24 ($V_{24MAX}$) is equal to $+V$ minus the $V_T$ of N3; i.e. $V_{24MAX} = [+V - V_T]$ volts. If $V_T$ of N3 is equal to or greater in magnitude than the $V_T$ of P3, P1 and N1 conduct concurrently, resulting in excessive power dissipation and in an undefined level at output 30.

Figure 2A:
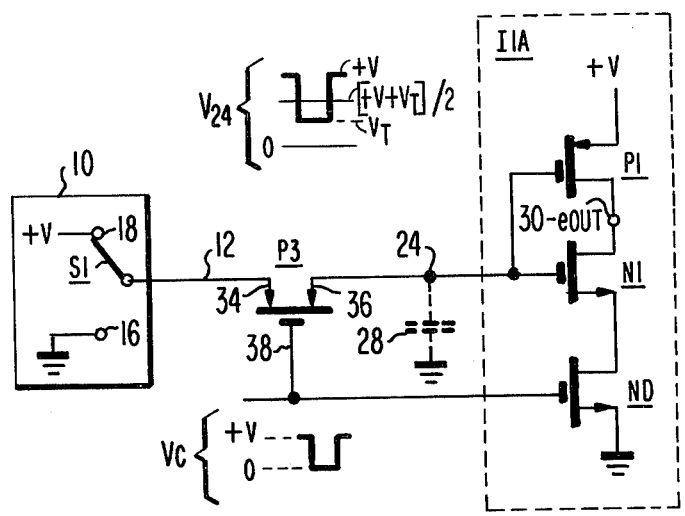
FIGS. 2A and 2B are schematic diagrams of circuits embodying the invention.

FIG. 2A illustrates an embodiment of the invention in which certain limitations and disadvantages associated with the use of a single gating transistor are avoided.

The circuit of FIG. 2A includes input source 10 and gating transistor P3 which are connected, and perform, as in FIG. 1A. Also, the gate electrodes of P1 and N1 are connected to terminal 24 with the source of P1 being connected to $+V$ and the drains of P1 and N1 being connected to output terminal 30 as in FIG. 1A. In addition, the circuit includes a controllable impedance comprising a depletion IGFET ND connected at its drain electrode to the source of N1, connected at its source electrode to ground, and having its gate electrode connected to the gate electrode of P3. P1, N1 and ND form an inverter I1A. ND functions as a controllable impedance which enables the toggle, quiescent, or switching point of inverter I1A to be selectively changed as discussed below.

Figure 3:
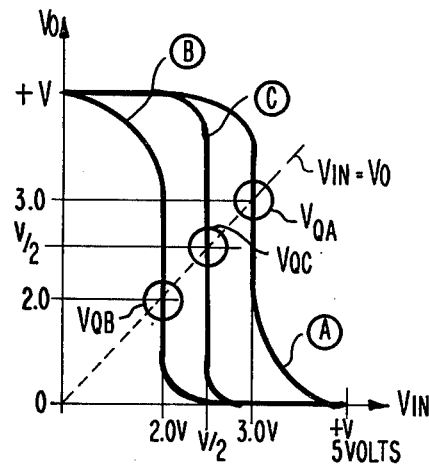
FIG. 3 is a drawing of the transfer characteristics of inverter circuits embodying the invention.

The role of ND may be better explained by first referring to FIG. 3, which shows the transfer characteristics of various complementary inverter combinations, and by noting that the switching point ($V_Q$) of a complementary inverter may be designed to occur at the intersection of its transfer curve and the line satisfying the equation $V_O = V_{IN}$, where $V_{IN}$ is the voltage applied to the gate electrodes of P1 and N1 and $V_O$ is the voltage at their common drain connection.

The shape of the transfer curve and hence the switching point ($V_Q$) of a complementary inverter is dependent (among others) on the characteristics and impedances of the N and P transistors forming the inverter. The impedance (Z) of each transistor is in turn a function of the ratio of its channel length (L) to its channel width (W), [$Z = f(L/W)$]. Curve C represents the transfer characteristic of an inverter whose P and N IGFETs have equal impedances for the same value of gate to source voltage ($V_{GS}$). In curve C, $V_{QC} = V_O = V_{IN} = V/2$.

When ND in FIG. 2A has +V volts applied to its gate (with its source at zero volts) the ON impedance of its conduction path is very low. For this condition the source of N1 is returned to ground via a relatively low impedance path, and the transfer characteristic of inverter I1A may be assumed to be as shown in waveform C of FIG. 3.

Referring to FIG. 2A, P3, when enabled, can charge terminal 24 to +V volts when $V_{12}$ is at +V volts, but P3 can only discharge terminal 24 to $V_T$ volts when $V_{12}$ is at zero volt. Hence, the boundary values (+V and $V_T$) of $V_{24}$ are asymmetrical with respect to +V and ground and with respect to the input signal at terminal 12. Whereas the range of voltage at node 12 is centered about V/2, the center value of $V_{24}$ (due to the $V_T$ offset of P3) is shifted to $[V+V_T]/2$. To compensate for the $V_T$ offset at node 24 inverter I1A (responsive to the signal at node 24) is "skewed" by applying a control signal of 0 volt to the gate of ND when a signal is coupled via P3 to the input of I1A. This substantially increases the effective impedance of the conduction path between output terminal 30 and ground in comparison to the impedance of the conduction path between terminal 30 and +V but since ND is a depletion device it remains conducting. Recall that a depletion device can conduct even with a $V_{GS}$ of zero volt as in the present example. However, with a $V_{GS}$ of 0 volt, the impedance of its conduction path is substantially greater than when a forward bias (i.e. a positive gate-to-source) potential is applied between its gate and source. The increased impedance of ND functions to increase the series impedance of the conduction paths (of N1 and ND) between terminal 30 and ground. The resultant transfer characteristics of inverter I1A for the condition when the $V_{GS}$ of ND is zero is shown in curve A of FIG. 3. Indeed, the quiescent point ($V_{QA}$) of inverter I1A is significantly more positive than V/2.

I1A is "skewed" such that its output will have one binary value (e.g. "low") for signals at node 24 more positive than $[V+V_T]/2$ and its output will have the other binary value (e.g. "high") for signals at node 24 less positive than $[V+V_T]/2$. By way of example, waveform A of FIG. 3 illustrates that for +V equal to 5 volts, and $V_T$ equal to 1 volt $V_{QA}$ of inverter I1A is 3.0 volts (for the condition of ND having a $V_{GS}=0$). Thus, for signals at node 24 below 3.0 volts ($V_{IN} < 3.0$ volts on curve) the output of inverter I1A would be very close to +V volts (P1 conducting) while for signals at node 24 above 3.0 volts the output of inverter I1A would be close to ground. Consequently, for values of $V_{24}$ equal to $V_T$ volts the output of I1A would be close to +V volts.

Thus, setting the switching or toggling point of inverter I1A at a value higher than V/2 ensure that, even with a residual $V_T$ at node 24, the output of the inverter will be well defined, e.g. assume a "high condition", for a zero input signal at node 12.

Varying the impedance of ND as described above enhances the operation of the circuit of FIG. 2A briefly discussed below.

When P3 is enabled ($V_C = 0$ volt) and $V_{12}$ is at +V volts, P3 conducts in the common source mode and node 24 is driven to +V volts. P1 whose gate and source are then at +V volts is turned-off and presents a very high "OFF" impedance between terminal 30 and +V volts. N1 with +V volts on its gate is turned-on hard and presents a relatively low impedance between its source-and-drain. ND with zero volts on its gate presents a relatively "high" impedance, but this "high" impedance is substantially less than the OFF impedance of P1. Typically, the OFF impedance of P1 is several orders of magnitude greater than the impedance of ND with its $V_{GS}$ equal to zero volt. Hence, N1 and ND which are ON and conducting can discharge terminal 30 to ground and cause $e_0$ to be at or close to zero volts.

When P3 is enabled and $V_{12}$ is at 0 volts, P3 conducts in the source follower mode and node 24 is discharge to $V_T$ volts. P1 whose source is at +V volts and whose gate is at +$V_T$ volts is turned-on hard and, therefore, presents a relatively low impedance path between +V and output terminal 30. ND with its gate and source at zero volt presents a relatively high impedance between its source-and-drain. Hence, ND, in and of itself, ensures that the impedance between terminal 30 and ground is significantly greater than the impedance between terminal 30 and +V. In addition, N1 with its gate at $V_T$ volts and its source returned to via the realtively high impedance of ND to ground also presents a relatively high source-to-drain impedance. Hence, N1 and ND present a very high impedance between terminal 30 and ground allowing $e_0$ at terminal 30 to be very close to +V volts. Therefore, the output of I1A is well defined due to the role of ND and the power dissipation of the inverter is relatively small.

Figure 2B:
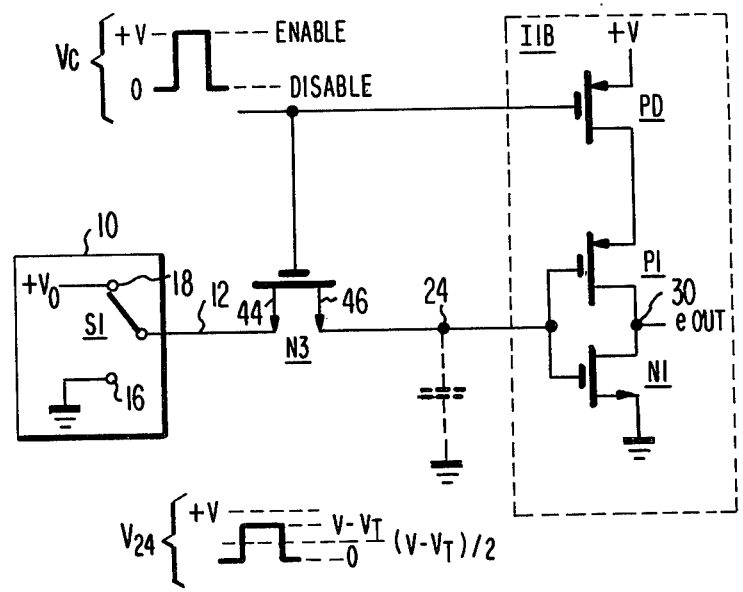

The circuit of FIG. 2B includes input source 10 and gating transistor N3 which are connected and perform as in FIG. 1B. Also, the gate electrodes of transistors P1 and N1 are connected to terminal 24, with the source of N1 being connected to ground and the drains of P1 and N1 being connected to terminal 30 as in FIG. 1B. However, in this circuit the source-to-drain path of a P type depletion transistor PD is connected between the source of P1 and +V volts, and the gate electrode of PD is connected to the gate electrode of N3. The control signal $V_C$ which swings between 0 and +V volts is applied to the gate electrodes of N3 and P3. PD, P1 and N1 form inverter I1B. The addition of PD and the ability to alter its gate voltage enables the toggle or quiescent point of inverter I1B to be selectively changed.

As noted above, when N3 is enabled ($V_C = +V$ volts) node 24 can be driven to ground when $V_{12}$ is grounded, but node 24 can only be changed to $[+V-V_T]$ volts when $V_{12}$ is at +V volts. Therefore, with +V applied to the gate of N3 and with $V_{12}$ varying between 0 and +V volts, $V_{24}$ varies between 0 and $[V-V_T]$ volts. To compensate for the $V_T$ offset at node 24 the quiescent point of inverter I1B is made settable to the mid range of the voltage at node 24; i.e., $[V-V_T]/2$. The addition of PD enables the quiescent point of inverter I1B to be shifted by controlling the potential applied to the gate of PD. When 0 volt is applied to the gate of PD, PD is turned-on hard and its source-to-drain impedance is very low whereby the source of P1 is coupled to +V via a very low impedance. For this signal condition the transfer characteristic of FIG. I1B may be assumed to be as shown in waveform C of FIG. 3.

When N3 is turned-on a signal of +V volts is applied to its gate. The same polarity and magnitude signal is applied to the gate of PD. PD with its source at +V volts and its gate at +V volts has a $V_{GS}$ of 0 volts. Since PD is a depletion device it remains conducting even with a $V_{GS}$ of 0 volt. However, (as with ND above), it should be appreciated that with its $V_{GS}=0$ the impedance of its conduction path is substantially greater than when a forward bias (i.e., a voltage between the source and gate applied in a direction to turn-it on harder) is applied to it. Increasing the impedance of PD increases the effective impedance between node 30 and +V volts since the conduction paths of P1 and PD are connected in series. Increasing the effective impedance of PD causes the switching point ($V_{QB}$) of inverter I1B to be shifted and set substantially below V/2 as illustrated by waveform B of FIG. 3. The $V_{QB}$ of inverter I1B is shifted from V/2 (see waveform C) to well below V/2 (see waveform B) by making the effective impedance of P1 and PD substantially greater than the effective impedance of N1 whenever information is coupled to inverter I1B via P3.

When N3 is enabled by $V_{12}$ is at ground, N3 conducts in the common source mode and node 24 is discharged to ground turning-off N1, while P1 and PD are turned-on. Since N1 is turned-off its source-to-drain path presents an extremely high impedance between output 30 and ground. Therefore, although PD with its $V_{GS}$ equal to zero functions as a relatively "high" impedance, its impedance is at least an order of magnitude lower than the OFF impedance of N1. Hence, the ratio of the series impedance of P1 and PD between +V and terminal 30 is sufficiently less than the OFF impedance of N1 to cause $e_0$ to be driven all the way to +V volts.

When N3 is enabled and $V_{12}$ is at +V volts, N3 conducts in the source follower mode and node 24 is driven to only $(V-V_T)$ volts. However, the conduction of N1 is sufficiently greater than the conduction of P1 and PD to enable the output 30 to go very close to ground. This may be demonstrated, by way of example, by referring to waveform B of FIG. 3. As soon as $V_{24}$ ($V_{IN}$ to inverter I1B) rises above 2.0 volts, the output of inverter I1B is driven below 2.0 volts. Thus, for values of $V_{24}$ at or close to $(V-V_T)$ volts the output of inverter I1B is well defined and since P1 and PD present a high series impedance between +V and terminal 30 there is little power dissipation. Therefore, the output of inverter I1B is well defined even though N3 does not couple the full input signal ($V_{12}$) to the input ($V_{24}$) of the inverter.

In FIGS. 2A and 2B, the gate electrodes of ND and PD were directly connected to the gate electrode of their respective gating transistors N3 and P3. It should be appreciated that the gate electrodes of ND and PD could be driven by a signal source or potential other than the one driving the gate electrode of the gating transistor. For example, the gate electrode of PD and ND could be driven by logic means responsive to the control voltage ($V_C$) and the value of the input signal in order to place a depletion transistor in a high impedance condition only when its associated gating transistor conducts in the source follower mode. Also the gate electrodes of the gating and depletion transistors could be driven by a ramp to provide a varying impedance.

The "skewable" inverters of FIGS. 2A and 2B are particularly useful in the design of memory cells.

Figure 4A:
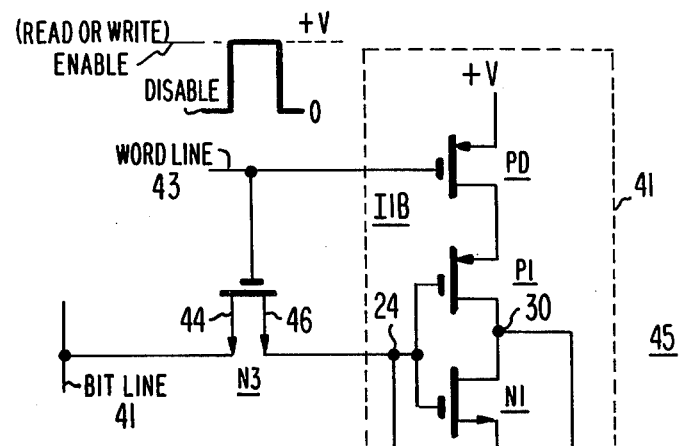
FIGS. 4A and 4B are schematic diagrams of memory cell circuits embodying the invention.
Figure 4B:
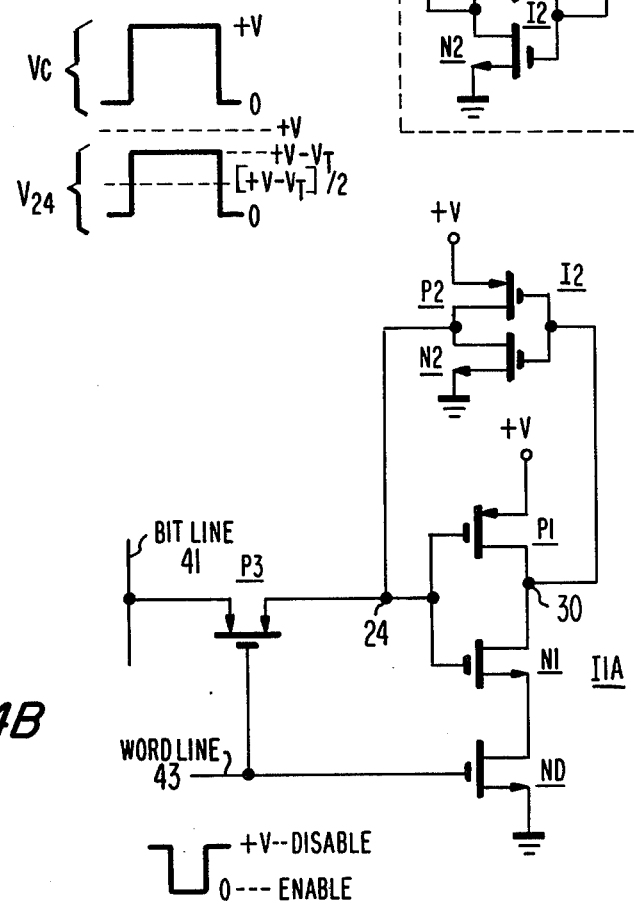

Known 5 transistor memory cells, as shown and discussed in U.S. Pat. Nos. 3,521,242 and 4,063,225, have some significant advantages in that they are small (use few components) and very few lines are required to access the cells. In these five transistor cells 4 transistors are interconnected to form a flip-flop while the fifth "gating" transistor functions as a single transistor transmission gate having its conduction path connected between a bit or input line and a single input-output line to the flip-flop. As noted above, when the gating transistor conducts in the source follower mode there is a voltage offset across the conduction path of the transistor. As a result, during the write mode the full value of the input signal for which the transistor conducts in the source follower mode is not fully applied to the flip-flop making the condition very difficult to write. Also, the impedance of the conduction path of a transistor conducting in the source follower mode is significantly greater than the impedance of its conduction path when it conducts in the common source mode, for the same value of turn-on gate voltage. When a gating transistor, conducting in the source follower mode, couples to the flip-flop a "new" signal of opposite binary value to the one stored in the flip-flop, the gating transistor must overcome one of the flip-flop transistors conducting in the common source mode. There is a voltage divider action between the two transistors which reduces the effect of the write in signal. This very serious problem is overcome in cross-coupled memory cell circuits embodying the invention as illustrated in FIGS. 4A and 4B. Also, in those designs, the cross-coupled connection, as discussed below, enables the elimination of the static power dissipation present when a single inverter is used.

The circuit of FIG. 4A corresponds to that of FIG. 2B with the addition of a complementary inverter I2 connected at its input to the output (30) of inverter I1B and at its output to the input (24) of inverter I1B. I2 and I1B are thus cross coupled and form a static storage circuit (flip-flop) 41 while N3 functions as the gating element used to selectively write information into, or to selectively read information out of, the storage element 41. The combination of N3 and flip-flop 41 form a memory cell 45, which may be any cell of a memory array (not shown).

I2 is comprised of P2 and N2 whose source electrodes are connected to +V volts and ground, respectively, whose gate electrodes are connected to terminal 30 to which is connected the drains of transistors P1 and N1, and whose drain electrodes are connected to terminal 24. The transistors other than PD are of the enhancement type. Hence, PD differs from the remaining transistors of the circuit in that it conducts even when its $V_{GS}$ is zero volt. The function of PD as a controllable impedance altering the switching point of inverter I1B to compensate for the offset of gating transistor N3 is further detailed below.

In the discussion of the operation of the circuits to follow, the storage of a "1" or "high" is arbitrarily defined as node 24 being at or close to +V volts with node 30 at or close to ground. The storage of a "0" or "low" is arbitrarily defined as node 24 being at or close to zero volts with node 30 at or close to +V. During the static storage condition, word line 43 is at zero volt causing PD to be turned-on hard and providing a low impedance conduction path between the source of P1 and +V volts. Thus, during the static storage condition PD does not significantly affect the operation of the memory cell, which functions in a similar manner to known 5 transistor memory cells.

However, during a write cycle, PD functions to weaken the storage of the "LOW" condition in element 41 to make it easier to write a "HIGH"—i.e. that condition for which N3 conducts in the source follower mode.

During, any write cycle, word line 43 is driven to +V volts turning on N3 and applying a $V_{GS}$ of 0 volt to PD. The conduction of PD is then significantly decreased which is equivalent to placing a relatively high impedance between the source electrode of P1 and +V volts. Increasing the impedance of PD causes the impedance of inverter I1B between +V and terminal 30 to be made significantly greater than the impedance between terminal 30 and ground for the same value of forward bias to P1 and N1.

The operation of the circuit of FIG. 4A for the condition of writing a "1" into the cell when a "0" is stored therein is now discussed. When a "0" is stored, $V_{30}$ is high so that N2 is ON, conducting in the common source mode, and providing a low impedance connection between node 24 and ground.

When bit line 41 and word line 43 are then set to +V volts, N3 is enabled and conducts in the source follower mode charging node 24 towards $[V_{DD}-V_T]$ volts. That is electrode 46 of N3 now functions as the source electrode.

Hence, when N3 is turned-on, the input voltage (V volts) on bit line 41 is divided across the conduction paths of N3 and N2. The voltage developed at node 24 is then a function of the impedance of N3 operating as a source follower to the impedance of N2 conducting in the common source mode. Since N3 is conducting in the source-follower mode its effective impedance is relatively large compared to its effective impedance when conducting in the common source mode, giving rise to the problem discussed above.

However, recall that when N3 is turned-on, the $V_{GS}$ of PD is set to 0 volt and PD functions as a high impedance connected between the source electrode of P1 and +V volts. Concurrent with increasing the impedance of PD and shifting the transfer characteristic of inverter I1B the voltage at node 24 is increasing. The increasing voltage at node 24 tends to turn-on N1 and turn-off P1. As soon as N1 begins to conduct, the effect of the high impedance of PD and the increasing impedance of P1 causes the voltage (V30) at output terminal 30 to drop sharply from the +V volt level toward ground. The drop in V30 decreases the conduction of N2 and initiates conduction in P2. Decreasing the conduction of N2, which is equivalent to increasing its impedance, alters the division ratio of N2 and N3 in a direction to allow $V_{24}$ to rise higher. The increase in $V_{24}$ tends to turn-on N1 still more and to turn-off P1 still more, further decreasing the conduction of N2 and increasing the conduction of P2. The process continues until terminal 30 is driven below $V_T$ volts turning-off N2. When that occurs, node 24 is driven to +V volts via the conduction path of P2 conducting in the common source mode. With $V_{24}$ at +V volts, P1 is turned-OFF and further conduction through P1 and PD is inhibited. Finally, N1 is ON, V30 is ground potential, P2 is fully ON clamping node 24 to +V volts, and N2 is fully OFF. Although N3 cannot itself drive node 24 to +V when operating in the source follower mode, that result is achieved by the regeneratively coupled inverters I1B, I2. The writing of a "1" into the cell is then completed. Storage element 41 is thus driven to a quiescent condition in which all levels are well defined and in which there is no quiescent power dissipation since P1 and N2 are OFF (except for leakage currents). After the "1" is written into the memory cell, the return of the word line to zero volt and the turn-off of N3 causes PD to be turned-on hard and the source of P1 to be again returned via a low impedance to +V volts. Consequently, the memory cell is then set to a very stable condition. Thus, it has been demonstrated that a "1" can be easily written into a memory cell formerly containing a "0" and that the "1" once written into the memory cell will be maintained and retained in the cell.

Although PD is used to skew inverter I1B to ease the writing of a "1" into the cell, it can be shown that a "zero" can still be easily written into a memory cell storing a "1". When N3 is enabled, with line 41 at zero volt, N3 conducts in the common source mode and it discharges node 24 quickly and easily from +V volts towards ground. This causes P1 to turn-on and decreaes the conduction through N1. The turn-on of P1 and the decreased conduction of N1 causes V30 to rise towards +V volts causing N2 to turn-on and decreasing the conduction through P2. Decreasing the conduction through P2 enables $V_{24}$ to be discharged further towards ground via the parallel conduction paths of N2 and N3. This causes P1 to turn-on harder and N1 to conduct less. Regeneration continues until $V_{24}$ is below $V_T$ volts. N1 is then turned-off and P1 and PD are ON. The impedance of N1-OFF is much higher than the series impedance of P1 and PD. Hence, P1 and PD can charge terminal 30 to +V even though PD functions like a relatively high impedance in series with P1. As a result, P2 is turned-off and N2 is turned-on hard and conducts in the common source mode to clamp node 24 to ground. Following the write operation N3 is turned-off and PD is turned-on hard again providing a low impedance connection between the source of P1 and +V. Therefore, it has been shown that either a "one" or a "zero" can be written into the memory cell and that the information will remain stored in the memory cell after the gating transistor N3 is turned-off, due to the cross coupling of the two inverters.

The information stored in the memory cell can be selectively read out in various ways without disturbing the contents of the cell and need not be detailed.

FIG. 4B illustrates the condition where the gating transistor (P3) is of P conductivity type. The circuit of FIG. 4B is like that of FIG. 2A with the addition of an inverter I2, the replacement of line 12 with a bit line 41, and the control voltage $V_C$ being supplied by a word line 43 connected to the gate electrodes of P3 and ND. Inverter I2 comprised of transistors P2 and N2 is connected at its input (the gate electrodes of P2 and N2) to terminal 30 (the drains of P1 and N1), and at its output (the drains of N2 and P2) to node 24. Also, the source of P2 is connected to +V volts and the source of N2 is connected to ground. Inverters I1A and I2 form the storage element of the memory cell and P3 is the gating transistor suitable for selectively writing information into the memory cell or for selectively reading information from the memory cell. Binary signals are applied to bit line 41 having a value of either +V volts (logic "1") or 0 volts (logic "0"). The control signal ($V_C$) applied to word line 43 also varies between +V volts and ground. When P3 is enabled ($V_C$ is 0 volt) and the bit line is at +V volts, P3 conducts in the common source mode and couples virtually the full +V volts from the bit line to terminal 24. When P3 is enabled and the bit line is at 0 volts while terminal 24 is charged to +V volts, P3 conducts in the source follower mode. When P3 is enabled, 0 volt is applied to the gate and source of ND and it is placed in a high impedance condition. However, ND can still conduct, since a reverse bias is needed to turn-it-off.

The operation of the circuit is similar to that of FIG. 2A with the addition of the regenerative feedback provided by inverter I2 and is of a complementary nature to the operation of the circuit of FIG. 4A described above.

When P3 conducts in the common source mode to write a "1" into the cell storing a "0" the conduction of P3 is sufficient to increase the potential at node 24 and to decrease the potential at node 30 to turn-on P2 and by regenerative action node 24 gets driven to +V volts via P2 and node 30 gets driven to ground potential via N1 and ND. P1 and N2 are driven into cut off and as in the circuit of FIG. 4A there is no static power dissipation. When P3 conducts in the source follower mode to write a "0" into cell storing a "1", ND is driven to a low conductive state and functions to increase the impedance between node 30 and ground, thereby easing the writing of the "1". When P3 conducts I1A is "skewed" by the application of 0 volt to the gate of ND. Thus, when node 24 is discharged towards ground potential, the potential at node 30 responds "early" increasing in a direction to turn-on N2 and turn-off P2. The output of I2 further discharges node 24 and accelerates the rise in potential at node 30 until P2 is turned-off and N2 is turned-on clamping 24 to ground. This turns-off N1 and ND and turns-on P1. Hence, there is again no static power dissipation.

When P3 is turned-off, after a "write "1" or a write "0", word line 43 is driven to +V volts (Disable and Condition) ND is turned-on providing a low impedance connection between the source of N1 and ground. The information stored in the cell remains unaffected. In particular, the stability of the memory cell is enhanced due to the low impedance connection.

Thus, it has again been shown that the difficult write condition, due to the gating transistor conducting in the source follower condition, has been resolved and that there is no quiescent power dissipation.

In FIGS. 4A and 4B a single depletion transistor of opposite conductivity type to the conductivity of the gating transistor, is connected in circuit with a complementary inverter to which input signals were applied via the gating transistor. FIG. 5 illustrates that a circuit embodying the invention may include an inverter I3 comprised of: (1) a depletion IGFET PD and an enhancement IGFET P1 having their conduction paths connected in series between an output terminal 30 and a first power terminal 51 to which is applied $V_{DD}$ volts; and (2) a depletion IGFET ND and an enhancement IGFET N1 having their conduction paths connected in series between terminal 30 and a second power terminal 53 to which is applied ground potential.

Inverter I3 is like inverter I1A or I1B except that the conduction path of a depletion transistor is connected in series with each enhancement transistor.

As in FIGS. 2 and 4 the gate electrodes of P1 and N1 are connected to the "signal" input node 24. However, the gate electrodes of PD and ND are connected in common to a source 55 of control voltage $V_C$. Source 55 may be common to the control source driving word line 43 or may be a separate and independent voltage control source.

An inverter I2 is connected at its input to the output (terminal 30) of inverter I3, and at its output to the signal input (node 24) of inverter I3. The conduction path of a gating transistor N3 is connected between a bit line 41 and node 24.

In the discussion of the operation of FIG. 5 to follow it is assumed that the same signal is applied to the gate electrodes of PD and ND and to word line 43.

The operation of the circuit will first be given for the condition of writing a "1" into the cell when a "zero" is being stored. When a "0" is being statically stored P1, PD and N2 are ON while N1, ND and P2 are OFF. During a write operation, word line 43 goes from zero volt to $V_{DD}$ volts. For this condition and with bit line 41 at $V_{DD}$, electrodes 44 and 46 function as the drain and source, respectively, of N3. N3 with $V_{DD}$ on its gate and drain electrodes conducts as a source follower and can only drive node 24 to [$V_{DD}-V_T$9 volts; where $V_T$ is the threshold voltage of N3. For the condition of "0" storage, N2 is on resulting in voltage divider action between transistors N3 and N2 and the voltage at node 24 being a function of the impedance of N3 to that of N2. However, during a write operation $V_{DD}$ volts is applied to the gates of ND and PD, whereby the conduction of ND is increased while the conduction of PD is decreased. This is equivalent to connecting the source of P1 via a relatively high series impedance to $V_{DD}$ while connecting the source of N1 via a significantly lower impedance to ground. This enables a shift in the transfer characteristic of I3. The combination of coupling (even part of) a "high" into node 24 and the shift in the transfer characteristic of I3 enables the potential at node 30 to decrease sharply. This causes P2 to be turned-on harder and for conduction through N2 to decrease. The impedance of N2 is thus effectively increased allowing node 24 to rise toward the [$V_{DD}-V_T$] volt level coupled via N3. The rise in potential at node 24 tends to further turn P1 off and N1 on, further increasing the impedance between $V_{DD}$ and node 30 while further decreasing the impedance between node 30 and ground. Consequently, $V_{30}$ goes towards ground further increasing the impedance of N2 while further increasing conduction through P2. When $V_{30}$ goes below $V_T$ volts, N2 is turned-off and P2 can charge node 24 to $V_{DD}$ volts. P1 and P2 are then turned-off and N1 and ND can discharge node 30 to ground. With node 30 at ground potential, P2-ON conducts in the common source mode and clamps node 24 to $V_{DD}$ volts. This effectively turns-off P1 and the writing of a "1" into the cell is completed. After a "1" is written into the memory cell word line 43 can return to zero volt and the "1" remains stored in the cell, even though PD is turned-on hard and ND is set to a high impedance condition.

With $V_{24}$ at, or close to, $V_{DD}$ volts P1 is turned-off and prevents conduction through PD such that there is no current (except for leakage) between terminal 51 and node 30. Thus, even with the gate and source of ND at zero volt, the OFF impedance of P1 is much greater than the impedance, albeit high, of ND. Therefore, $V_{30}$ is held at, or close to, ground potential. Accordingly, P2 remains turned-on hard clamping node 24 to $V_{DD}$ and N1 and ND remain turned-on. Thus, a "one" can be written into a memory cell formerly containing a "zero" and the "one" once written into the memory cell will be retained in the cell after the turn-off of the gating transistor.

It now remains to be shown that a "zero" can be written into a memory cell storing a "one".

As before, during a write operation $V_{DD}$ is applied to the gate electrodes of N3, ND and PD. This turns-on N3, causing PD to assume a relatively high impedance, and ND to assume a relatively low impedance. However, for N3 ON and the bit line 41 at zero volt, N3 conducts in the common source mode and quickly causes $V_{24}$ to decrease causing P1 to be turned-on and the conduction through N1 to decrease. This causes the potential at node 30 to rise causing N2 to turn-on and decreasing the conduction through P2. Decreasing the conduction through P2 with N2 and N3 conducting enables the potential at node 24 to go still further towards ground. This causes P1 to turn on harder and N1 to conduct even less causing $V_{24}$ to rise towards $V_{DD}$ tending to turn-off P2 and turning-on N2 thereby accelerating the discharge of node 24 to ground. When the potential at node 24 drops below $V_T$, N1 is turned-off inhibiting conduction through ND. The OFF impedance of N1 is now very high such that the impedance between node 30 and ground is much greater than the impedance between node 30 and $V_{DD}$ even though PD has $V_{DD}$ volts applied to its gate and source and is in a high impedance condition. As a result, P2 is turned-off while N2, conducting in the common source mode, is turned-on hard clamping node 24 to ground.

When the word line returns to ground and N3 is turned-off PD is placed in a low impedance condition while ND is placed in a high impedance condition. PD and P1 then provide a relatively low impedance between $V_{DD}$ and node 30 ensuring that N2 is turned-on and remains turned-on and that the "zero" is stored in the memory cell. Therefore, it has been shown that either a "one" or a "zero" can be written into the memory cell and that this information will remain stored in the memory cell after the gating transistor is turned-off.

The one or the zero can be read out from the memory cell without disturbing its contents in various ways and need not be detailed.

In FIGS. 2 through 5 the use of the depletion transistors (PD and/or ND) in a novel manner was demonstrated. It is now shown in FIGS. 6 through 8 that the depletion transistors provide a significant advantage in the construction of complementary inverters and/or of memory cells of the type shown in FIG. 5.

Figure 7:
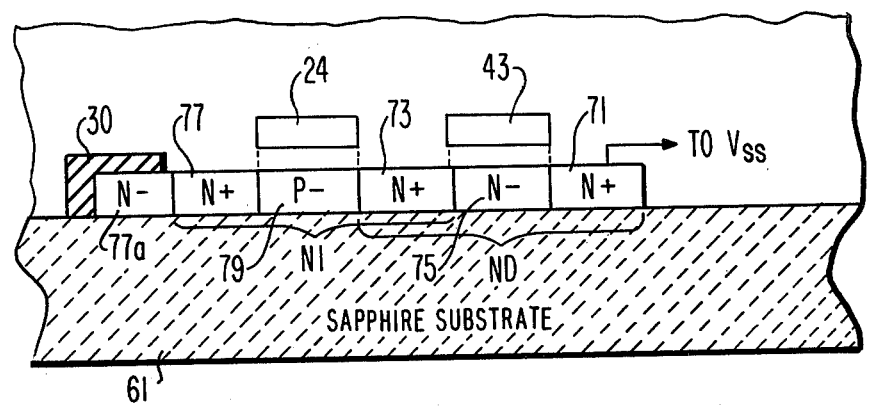
FIG. 7 is a cross section of the portion of the integrated circuit shown in FIG. 6 taken along the line 7—7 of FIG. 6.
Figure 8:
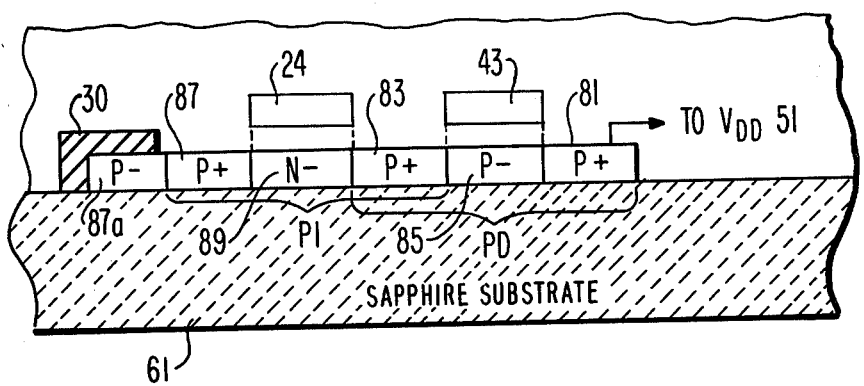
FIG. 8 is a cross section of the position of the integrated circuit shown in FIG. 6 taken along the line 8—8 of FIG. 6.

FIG. 6 presents a modified plan view of the memory cell layout and FIGS. 7 and 8 present cross sectional views of parts of the memory cell of FIG. 5 manufactured using, by way of example, the SOS technology. (With appropriate modifications the cells may be manufactured in bulk silicon.) The cell comprises a sapphire substrate 61 having a silicon epitaxial layer formed thereon. IGFETS P1, PD, N1, ND, P2, N2 and N3 are formed in the silicon epitaxial layer. P+ epitaxial ("epi") regions in FIG. 6 are shown using small dots whereas N+ epi regions are shown with larger circular dots. All oxide layers are omitted from FIG. 6, but are present in FIGS. 7 and 8 to help clarify the structure of the memory cell devices. The positive power supply voltage, $V_{DD}$ is shown connected to the source electrodes of PD and P2 via metal contacts 67 and 69, respectively. Similarly, $V_{SS}$ or ground return is shown connected to the source electrodes of ND and N2 via metal contacts 70 and 72, respectively. The structure of the N conductivity type transistors forming inverter I3 is best illustrated with reference to FIG. 7. FIG. 7 shows the N+ doped epi source 71 of transistor ND separated from its N+ doped epi drain region 73 by an N− channel region 75. The drain region 73 of transistor ND functions as the source region of transistor N1. Region 73 of transistor N1 is separated from its N+ drain region 77 by a P− channel region 79. Region 77 abuts a region 77a of like N+ conductivity type to which a [direct] polysilicon contact 30 is made. Overlying the channel region 75 is a polysilicon gate which is connected to word line 43. Overlying the channel region 79 is a polysilicon conductor which contacts node 24.

The structure of the P conductivity type transistors forming inverter I3 is shown in FIG. 8. Transistor PD is shown with its P+ doped epi source region 81 separated from its P+ drain region 83 by a P− channel region 85. Region 83 also functions as the source region of transistor P1. The source of P1 is separated from its P+ drain region 87 by an N− channel region 89. Drain region 87 abuts a region 87a of P+ conductivity type to which a polysilicon contact 30 (connecting drain of P1 to drain of N1) is made. Overlying the P-channel region 85 is a polysilicon, or metal gate, electrode connected to word line 43. Overlying region 89 is a polysilicon gate electrode connected to node 24.

Referring back to FIG. 6 it may be seen that the drains 92 and 94 of P2 and N2, respectively, are connected to a contact 24 which connects to a polysilicon line which extends over the channel regions of P1 and N1 and forms their gate electrodes. The drains of P1 and N1 make contact to a polysilicon line at contact 30 which extends over the channel regions of P2 and N2 and forms their gate electrodes. Contact 24 or node 24 also makes contact to the source/drain region 46 of gating transistor N3 while the drain/source region 44 of transistor N3 is connected to, or makes contact with, bit line 41. The significance of the memory cell structure shown in FIG. 6 is that it is very compact and requires very little space. The compactness of the layout results because the depletion transistors PD and ND are used as "crossunders" below the polysilicon word line 43 and thereby provide an additional level of interconnect which consumes effectively no area.

In this example, a complementary inverter comprising transistors P1 and N1 is coupled to $V_{DD}$ and ground by means of depletion type transistor interconnects. That is the source of P1 is connected via the conduction path of transistor PD to the $V_{DD}$ supply line while the source of N1 is connected to the ground or negative supply line via the conduction path of depletion type transistor ND. It should be evident that the use of depletion transistors as "crossunders" is applicable to interconnect any inverter.

That is, in any number of logic circuits, depletion type transistors can be used as resistive elements of fixed, or variable, value to couple voltages or currents, without the need of an additional metal or polysilicon layer.

In brief, as a result of the present invention extremely dense memory cells can be manufactured which make use of the depletion transistors to improve writing and as crossunders to couple $V_{DD}$ and ground to the source electrodes of enhancement IGFETS forming a complementary inverter.

The substrate 61 is shown to be sapphire but it could also be any other insulator such as spinel or monocrystalline aluminum oxide. In addition, the circuits of the invention can as well be formed in bulk silicon. The N conductivity type transistors would be formed in a P-well region formed in an N type substrate and the P conductivity type transistors would be formed in the N type substrate. An N depletion transistor would be formed with two N+ regions separated by a N− surface region. Similarly, a P depletion transistor would be formed with two P+ regions separated by a P− surface region.

What is claimed is:

1. The combination comprising:
 a first insulated-gate field-effect transistor (IGFET) of first conductivity type and of the enhancement type;
 second and third IGFETs of second conductivity type and of the enhancement type;
 a fourth IGFET of first conductivity type and of the depletion type; eah IGFET having a conduction path and a control electrode for controlling the conductivity of said conduction path;
 an input line, and an output node;
 first and second power terminals for the application therebetween of an operating potential;
 means connecting the conduction path of said second IGFET between said input line and the control electrodes of said first and third IGFETs;
 means connecting one end of the conduction path of said third IGFET to the first power terminal;
 means connecting the other end of the conduction path of said third IGFET to one end of the conduction path of said first IGFET at said output node;
 means connecting the conduction path of said fourth IGFET between the other end of the conduction path of said first IGFET and said second power terminal; and
 means for controlling the conductivity of said second and fourth IGFETs including means for applying a signal to the gate electrodes of said second and fourth IGFETS for selectively turning-on said second IGFET and for concurrently applying a signal to the gate electrode of said fourth IGFET having a polarity and magnitude to substantially, but not wholly, decrease conduction through said fourth IGFET, when said second IGFET is turned-on.

2. The combination as claimed in claim 1 wherein said means connecting the one end of the conduction path of said third IGFET to said first power terminal includes a fifth IGFET of second conductivity type and of the depletion type having its conduction path connected between said one end of the conduction path of said third IGFET and said first power terminal, and having its control electrode connected to the control electrode of said fourth IGFET.

3. The combination as claimed in claim 2 wherein said means for applying a signal to said second and fourth IGFETs includes means directly connecting the control electrodes of said fourth and fifth IGFETs to the control electrode of said second IGFET.

4. The combination as claimed in claim 3 further including an inverter having a signal input and a signal output; and
 means for connecting said signal input to said output node and said signal output to the control electrodes of said first and third IGFETs.

5. The combination as claimed in claim 1 wherein said second and third IGFETs are of N-conductivity type and wherein said first and fourth IGFETs are of P-conductivity type.

6. The combination as claimed in claim 5 further including an inverter having a signal input and a signal output; and
 means for connecting said inverter signal input to said output node and said inverter signal output to the control electrodes of said first and third IGFETs.

7. The combination as claimed in claim 1 wherein said first and fourth IGFETS are of N-conductivity type and wherein said second and third IGFETs are of P conductivity type.

8. The combination as claimed in claim 7 further including an inverter having a signal input and a signal output; and
 means for connecting said inverter signal input to said output node and said inverter signal output to the control electrodes of said first and third IGFETs.

9. The combination as claimed in claim 1 wherein the conduction path of each one of said IGFETs terminate at one end at a source electrode and at the other at a drain electrode, and
 wherein the source of said fourth IGFET is connected to said second power terminal and its drain is connected to the source of said first IGFET, and wherein the source of said third IGFET is connected to said first power terminal.

10. An inverter comprising:
 first and second power terminals;
 an input terminal and an output terminal;
 first and second enhancement transistors of complementary conductivity type, each transistor having a control electrode and source and drain electrodes defining the ends of a conduction path;
 means connecting the control electrodes of said first and second transistor to said input terminal;
 means connecting the drain of said first and second transistors to said output terminal;
 means connecting the source of said first transistor to said first power terminal; and
 a controllable impedance means connected between the source electrode of said second transistor and said second power terminal for selectively shifting the transfer characteristic and the toggle point of the inverter, said controllable impedance means comprising a depletion type transistor having a control electrode and a conduction path, the conduction path of said depletion transistors being connected between the source of said second transistor and said second power terminal; and
 means connected to the control electrode of said depletion transistor for varying the potential applied thereto for varying the impedance of its conduction path.

11. The combination as claimed in claim 10 wherein the controllable impedance means is a depletion type transistor of the same conductivity type as the transistor to which it is connected.

12. The combination as claimed in claim 10 wherein said means connecting the source of said first transistor to said first power terminal includes another controllable impedance means.

13. The combination as claimed in claim 10 further including means for applying a signal to said input terminal comprising a single gating transistor having its conduction path connected between a signal source and said input terminal, said gating transistor being of opposite conductivity type to the conductivity of said depletion transistor.

14. The combination as claimed in claim 10 wherein said depletion transistor and said second transistor are of P conductivity type and wherein said first transistor is of N conductivity type.

15. The combination as claimed in claim 10 wherein said depletion transistor and said second transistor are of N conductivity type and wherein said first transistor is of P conductivity type.

16. In combination with a flip-flop comprised of two cross coupled inverters each inverter including a transistor having a main conduction path and a control electrode, the main conduction path of each transistor being connected at one end to the control electrode of the transistor of the other inverter, said one end of the main conduction path of each transistor being coupled via respective load means to a first point of operating potential; and one of said one end of a main conduction path defining an input point and a single gating transistor having its conduction path connected between said input point and a single input line, and wherein for one value of input data on said line said gating transistor conducts in the follower mode whereby the value of the data signal coupled to said input point is offset, the improvement comprising:

a controllable impedance connected in series with the main conduction path of one of said inverter transistors, said controllable impedance being connected between the other end of the main conduction path of said one of said inverter transistors and a second point of operating potential, for selectively skewing said one of said two inverters in a direction to compensate for the offset of said gating transistor.

17. In the combination as claimed in claim 16, wherein the other end of the main conduction path of the other one of said inverter transistors is connected via negligible impedance means to said second point of operating potential.

18. An integrated circuit structure comprising:
a substrate;
a first enhancement insulated-gate field-effect transistor (IGFET) of first conductivity type having source and drain regions of said first conductivity type defining the ends of a conduction channel region of second conductivity type formed on said substrate;
second and third enhancement IGFETs, each IGFET having source and drain regions of second conductivity type defining the ends of a conduction channel of first conductivity type formed on said substrate;
a depletion IGFET of said first conductivity type formed on said substrate having a source and drain regions defining the ends of a conduction channel region;
each one of said IGFETs having a gate oxide region overlying its channel region and a gate electrode of conductive material formed over said gate oxide region;

means connecting the source to drain conduction path of said depletion IGFET between the source region of said first IGFET and a first power terminal;
means connecting the source region of said second IGFET to a second power terminal;
means for connecting one of said source and drain regions of said third IGFET to an input signal source and means connecting the other one of said source and drain regions of said third IGFET to the gate electrodes of said first and second IGFETs;
conductive material connecting the gate electrodes of said third IGFET and said depletion IGFET; and
means connecting the drains of said first and second IGFETs in circuit to output means.

19. The combination as claimed in claim 18 wherein said means connecting the source region of said second IGFET to said second power terminal includes a depletion IGFET of second conductivity type formed on said substrate having a source-to-drain conduction path through a channel region a gate electrode overlying said channel region, and wherein said source-to-drain conduction path of said second conductivity type depletion IGFET is connected between the source of said second IGFET and said second power terminal, and further including conductive material connecting its gate electrode to that of said depletion IGFET of said first conductivity type.

20. An integrated circuit structure comprising:
a body of semiconductor material;
a first enhancement insulated-gate field-effect transistor (IGFET) of first conductivity type having source and drain regions of said first conductivity type defining the ends of a conduction channel region of second conductivity type formed in said semiconductor body;
second and third enhancement IGFETs, each IGFET having source and drain regions of second conductivity type defining the ends of a conduction channel of first conductivity type formed in said semiconductor body;
a depletion IGFET of said first conductivity type formed in said semiconductor body having a source drain conduction path through a channel region;
each one of said IGFETs having a gate oxide overlying its channel region and a gate electrode of conductive material formed over said channel region;
means connecting the source to drain conduction path of said depletion IGFET between the source region of said first IGFET and a first power terminal;
means connecting the source region of said second IGFET to a second power terminal;
means for connecting one of said source and drain regions of said third IGFET to an input signal source and means conecting the other one of said source and drain regions of said third IGFET to the gate electrodes of said first and second IGFETs;
means connecting the gate electrode of said third IGFET to the gate electrode of said depletion IGFET;
and
means connecting the drains of said first and second IGFETs in circuit to output means.

21. The integrated circuit structure of claim 20 wherein:

the body of semiconductor material is an island of single crystal silicon formed on an insulated substrate selected from the group consisting of sapphire, spinel, and monocrystalline aluminum oxide.

22. An integrated circuit structure comprising:

a first enhancement insulated-gate field-effect transistor (IGFET) having source and drain regions of first conductivity type defining the ends of a conduction channel region of second conductivity type;

second and third enhancement IGFETs, each IGFET having source and drain regions of second conductivity type defining the ends of a conduction channel of first conductivity type;

a depletion IGFET of said first conductivity type having a source-to-drain conduction path through a channel region;

each one of said IGFETs having a gate oxide overlying its channel region and a gate electrode of conductive material formed over said gate oxide region;

means connecting the source to drain conduction path of said depletion IGFET between the source region of said first IGFET and a first power terminal;

means connecting the source region of said second IGFET to a second power terminal;

means for connecting one of said source and drain regions of said third IGFET to an input signal source and means connecting the other one of said source and drain regions of said third IGFET to the gate electrodes of said first and second IGFETs;

conductive material connecting the gate electrodes of said third IGFET and said depletion IGFET; and means connecting the drains of said first and second IGFETs in circuit to output means.

* * * * *

UNITED STATES PATENT AND TRADEMARK OFFICE
CERTIFICATE OF CORRECTION

PATENT NO. : 4,463,273

DATED : July 31, 1984

INVENTOR(S) : Andrew G. F. Dingwall

It is certified that error appears in the above-identified patent and that said Letters Patent is hereby corrected as shown below:

Col. 2, line 21, change "position" to - - - portion - - -.

Col. 2, line 62, change "occcur" to - - - occur - - -.

Col. 6, line 33, change "discharge" to - - - discharged - - -.

Col. 6, line 43, delete the word "to" after returned.

Col. 6, line 43, change "realtively" to - - relatively - - -.

Col. 6, line 68, change "changed" to - - - charged - - -.

Col. 10, line 31, change "decreaes" to - - - decreases - - -.

Col. 11, line 46, delete the quotation mark before "write".

Col. 12, line 30, change "$V_T 9$" to - - - $V_T$] - - -.

Col. 15, line 27, change "eah" to - - - each - - -.

Signed and Sealed this

Eighteenth Day of December 1984

[SEAL]

Attest:

Attesting Officer

GERALD J. MOSSINGHOFF

Commissioner of Patents and Trademarks